United States Patent [19]

Kobayashi

[11] Patent Number: 5,559,365

[45] Date of Patent: Sep. 24, 1996

[54] SEMICONDUCTOR DEVICE INCLUDING A PLURALITY OF LEADS EACH HAVING TWO END PORTIONS EXTENDING DOWNWARD AND UPWARD

[75] Inventor: Shotaro Kobayashi, Tokyo, Japan

[73] Assignee: NEC Corporation, Tokyo, Japan

[21] Appl. No.: 365,226

[22] Filed: Dec. 28, 1994

[30] Foreign Application Priority Data

Dec. 28, 1993 [JP] Japan .................................. 5-334466

[51] Int. Cl.⁶ .................................................. H01L 23/02
[52] U.S. Cl. ......................... 257/666; 257/670; 257/671; 257/686; 257/723; 257/787
[58] Field of Search ...................................... 257/787, 686, 257/670, 671, 666, 723

[56] References Cited

U.S. PATENT DOCUMENTS 5,157,475  10/1992  Yamaguchi .............................. 257/787
5,394,010   2/1995  Tazawa .................................. 257/686

FOREIGN PATENT DOCUMENTS 63-182845   7/1988  Japan .
2-42431     3/1990  Japan .
4-256351    9/1992  Japan .
4-290257   10/1992  Japan .

Primary Examiner—William Mintel
Assistant Examiner—Roy Potter
Attorney, Agent, or Firm—Young & Thompson

[57] ABSTRACT

Disclosed herein is a semiconductor device having a terminal bend protecting frame formed in the terminal tip parts by filling the spaces between the lead terminals with a resin of the same quality as that of the sealing resin. In other words, each of lead terminals led from a package has a first end portion extending upward and a second end portion extending downward.

10 Claims, 6 Drawing Sheets

SEMICONDUCTOR DEVICE INCLUDING A PLURALITY OF LEADS EACH HAVING TWO END PORTIONS EXTENDING DOWNWARD AND UPWARD

BACKGROUND OF THE INVENTION

This invention relates to a semiconductor device and, more particularly, to an improvement in shape of each of leads extended from a package of a semiconductor device.

In recent years, downsizing and multi-functionalism of electronic equipment and apparatus have been advanced all the more, and the demands for more space saving higher device integration and more package pins have been being emphasized evermore. Accompanying these trends, reduction of the thickness and the interterminal spacing are being advanced at a rapid pace for the flat packages. As the results of the reduction, strength of the package pins is lowering.

A semiconductor chip is first mounted on a leadframe in the mounting process, and is bonded to the respective leads of the lead frame by gold wires or the like. Next, the chip is sealed by resin in the sealing process. A semiconductor device is thereby produced. This device is then subjected to a screening. In the screening process, it is general to subject the device to be tested to an accelerated test of long period at high temperature and high voltage, after a primary screening, in order to remove defects in the initial stage of manufacture. Following that, a secondary screening is carried out. Finally, cutting of the frame and forming of the terminals are carried out in the lead forming process.

In the screening process, however, a plurality of devices are arranged on a test board in parallel to one another in the horizontal direction. For this reason, the number of devices is restricted, so that the productivity is extremely poor especially in the accerelated test which extends over a long period of time.

SUMMARY OF THE INVENTION

It is therefore an object of the present invention to provide a semiconductor device requiring a less occupying area on a test board in a screening test.

A semiconductor device according to this invention is characterized in that each of lead terminals led from a package has first and second end portions extending upward and downward, respectively.

With this feature, in a screening process, a plurality of semiconductor devices are mounted on a test board such that the first end portion of each lead terminal of one device is in contact with the second end portion of the associated lead terminal of the adjacent device. In other words, the devices are arranged such that each of them has its package standing perpendicularly to the surface of the test board. Accordingly, a number of the devices can be mounted on the test board and thus tested simultaneously.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

Prior to preceeding to the description on an embodiment of the present invention, a detailed description on the prior art will be first made below in order to facilitate the understanding of the present invention.

Figure 1:
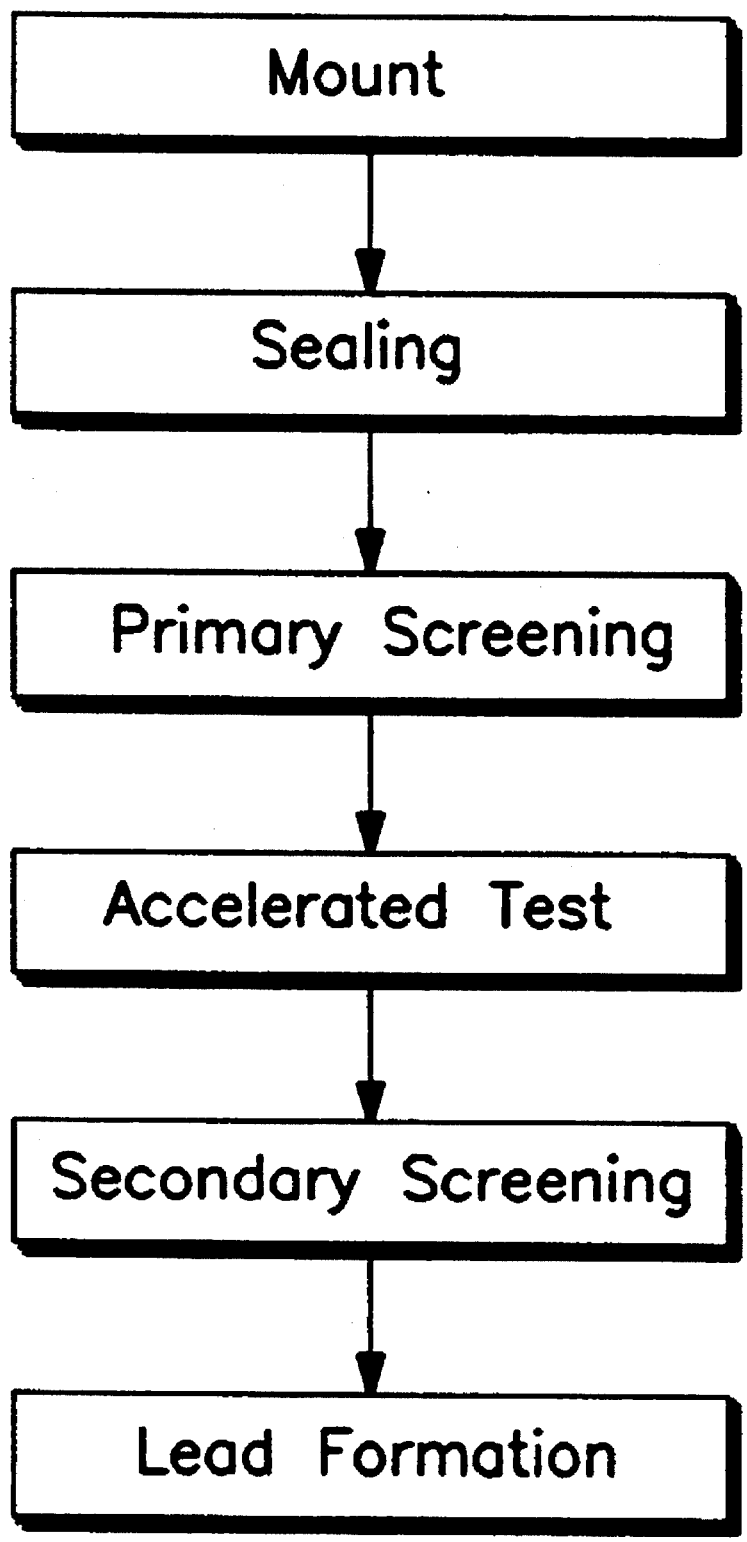
FIG. 1 is a flow chart showing the manufacturing process of the semiconductor device.

Referring to FIG. 1, a semiconductor chip having a plurality of circuit elements through the so-called diffusion process is first mounted on a lead frame in the mounting process, and is bonded to terminals of the lead frame by gold wires or the like. Next, the chip is sealed by resin in the resin molding process. Then screening process is performed. In general, the screening process of a flat package is performed with the frame of the lead frame intact in order to protect the terminals from being bent.

Figure 2A:
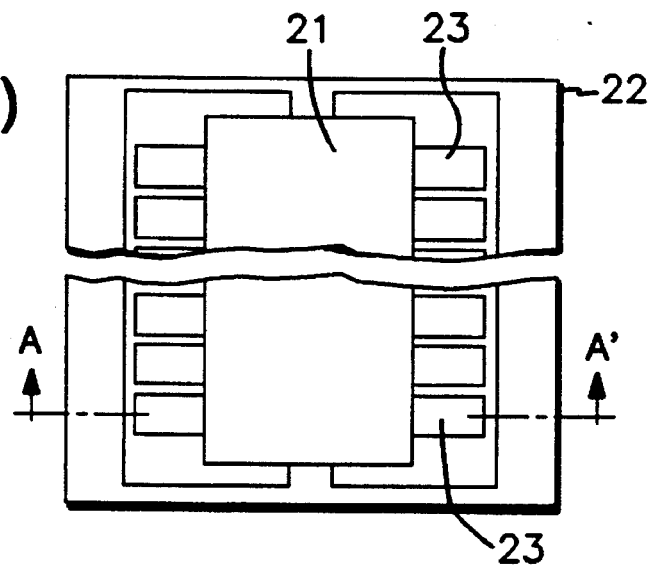
FIG. 2(a) and FIG. 2(b) are a plan view and a sectional view, respectively, showing a prior art.
Figure 2B:
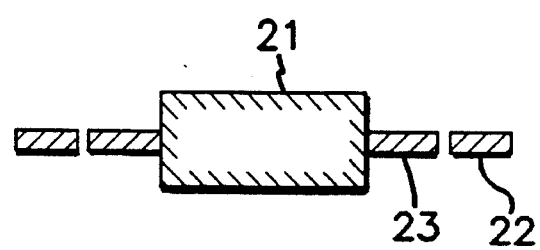

As shown in FIGS. 2(a) and 2(b), a conventional terminal protecting frame 22 led out from chip sealing part 21 will not be cut off until the final process to protect the terminals 23 as mentioned above. In that case, terminals 23 need be isolated electrically so that they are constructed in such a manner to be supported by the chip sealing part 21 alone, putting them in an extremely unstable condition which tends to generate defects due to bending of the terminals 23. In a primary screening process, for example, appearance of the resin molded semiconductor chip is checked to remove defective chips. Then, unremoved sample semiconductor chips are subjected to an accelerated test of long period at high temperature and high voltage. In case of the test for random access memory (RAM) devices, all the memory cells in the RAM devices are accessed in order by address signals to write data in it at the high temperature and the high power voltage application. For example, the high temperature is about 125° C. The high power voltage is, for example, 8 V for the device normally operating with 5 V power source. By the accelerated test, it becomes easy to find out semiconductor devices having insufficient electrical characteristics or electrically defective devices. Following that, a secondary screening is carried out to remove the semiconductor chips having insufficient electrical characteristics and defective devices. In reality, the screening is completed only after several screening processes. Finally, cutting of the terminal protecting frame 22 and bending the terminals 23 to form package pins are carried out in the lead forming process.

To eliminate undesirable bending of the terminals 23, various ideas are proposed. For example, methods for solving the above problem are disclosed in Japanese Laid-Open Utility Model Application No. Hei 2-42431 and Japanese Laid-Open Patent Application No. Hei 4-290257. Referring to the drawings, these methods will be described below.

Figure 3A:
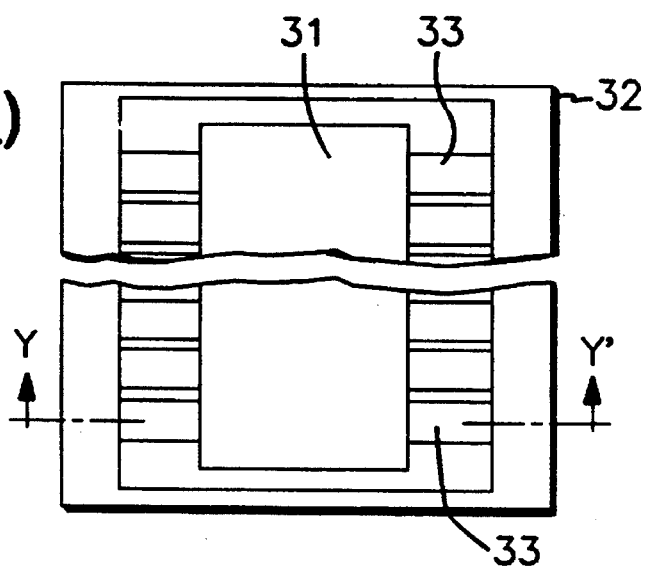
FIG. 3(a) and FIG. 3(b) are a plan view and a sectional view, respectively, showing another prior art.
Figure 3B:
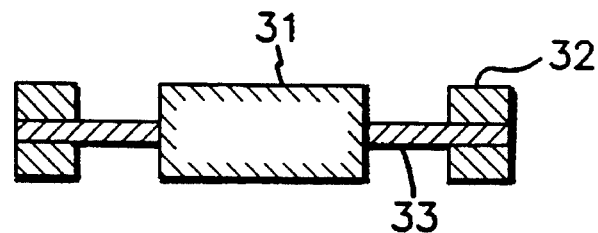

FIG. 3(a) is a plan view showing the constitution of the conventional semiconductor device described in the Japanese Laid-Open Utility Model Application No. 2-42431, and FIG. 3(b) is a sectional view of the device along the line Y—Y' in FIG. 3 (a). In the figure, 31 is a chip sealing part of the semiconductor device, 32 is a terminal protecting frame and 33 is a terminal. In the package shown in the figure, what is corresponding to the terminal protecting frame 22 in FIGS. 2(a) and 2(b) is already cut and removed. Instead of that, during the sealing process for the chip sealing part 31, the terminal protecting frame 32 is formed to cover the tip parts of the terminals using the same material as the sealing resin. Therefore, mechanical strength of the terminals 33 is enhanced while maintaining their electrical independence, and the bending strength of the terminals 33 is drastically improved by their being supported at both ends. Moreover, the chip sealing part 31 is held more stably compared with the case in FIGS. 2(a) and 2 (b), since it is held also by all the terminals 33.

Figure 4A:
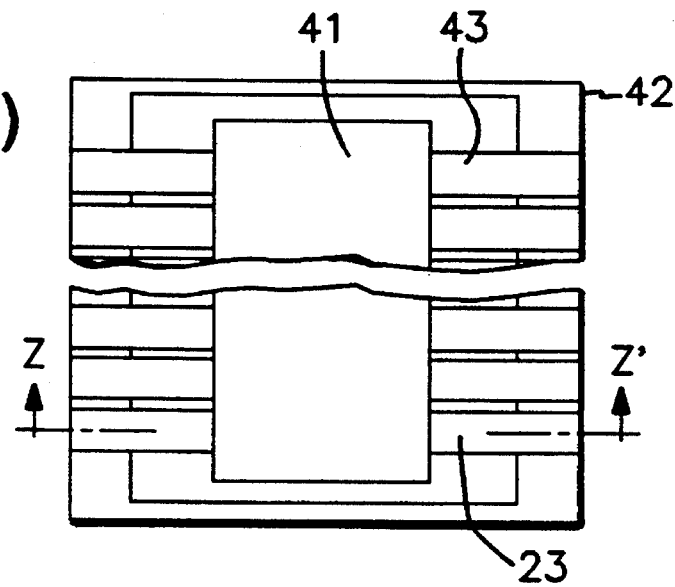
FIG. 4(a), FIG. 4(b) and FIG. 4(c) are a plan view, a sectional view and a perspective view after lead formation of the semiconductor device, respectively, showing still another prior art.
Figure 4B:
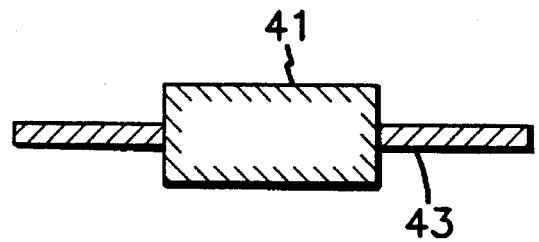
Figure 4C:
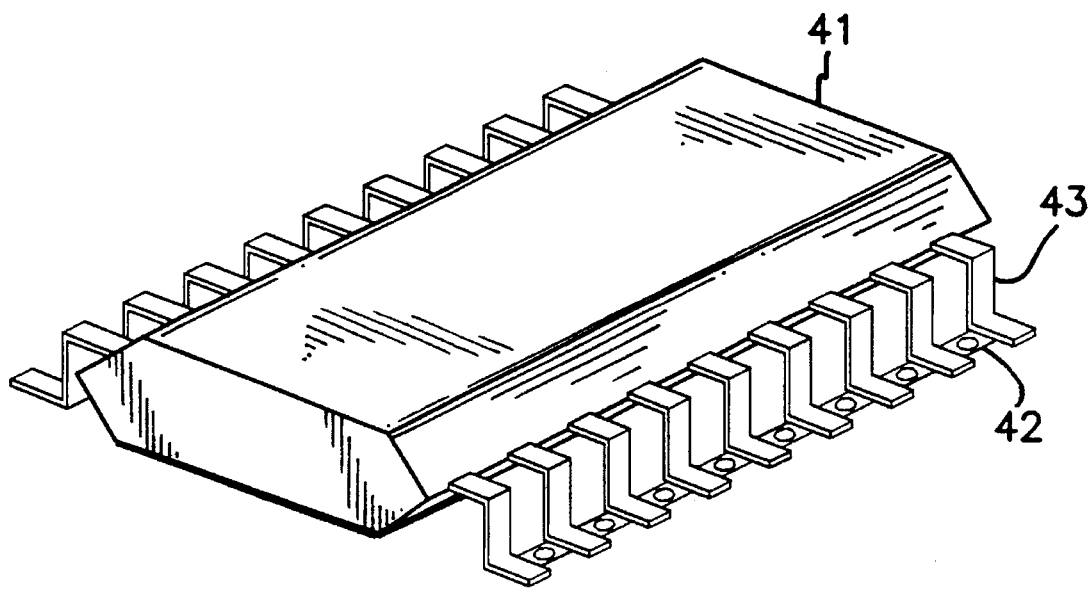

FIG. 4(a) shows a plan view of the constitution of the conventional semiconductor device described in the Japanese Laid-Open Patent Application No. Hei 4-290257, and FIG. 4(b) is a sectional view of the device along the line Z—Z'. In the figure, 41 is a chip sealing part of the semiconductor device, 42 is a terminal protecting frame and 43 is a terminal. In the package shown in this figure, the part corresponding to the terminal protecting frame 52 in FIGS. 2(a) and 2(b) is already cut and removed, similar to the state shown in FIGS. 3 (a) and 3 (b). In FIGS. 3(a) and 3(b), the terminal protecting frame 32 is given a thickness greater than the thickness of the terminal 33 itself, namely, the frame 32 covers completely the tip of the terminals 33. However, in FIGS. 4(a) and 4(b), resin is formed only in the spaces between the tips of the terminals 43 as shown by the sectional view in FIG. 4(b). As in the above, as the terminal protecting frame 42 made of same material as the sealing resin is formed in the spaces between tip parts of the terminals 43, it is possible to obtain an advantage of giving a protective effect even after the formation of the leads due to the presence of the lead bend protecting resin between the terminals 43. A perspective view after the lead formation is given in FIG. 4(c).

Figure 5:
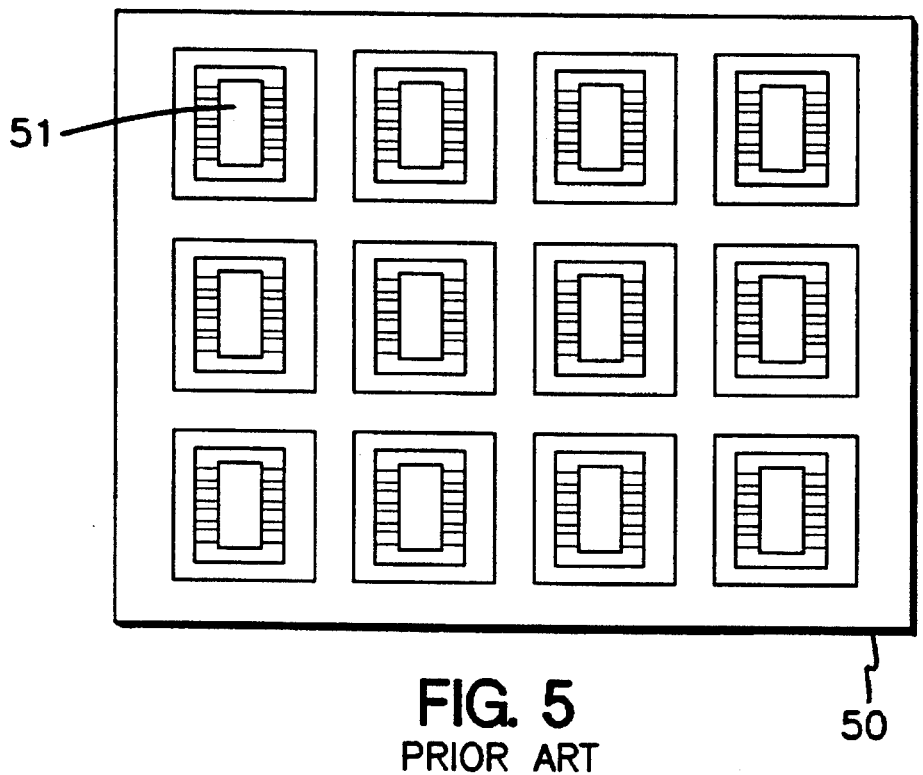
FIG. 5 is a drawing showing the mounting state on a test board of conventional semiconductor devices.

As described in the above, these conventional techniques exhibit a significant effect on the terminal bending of the flat package. However, in the screening process, the semiconductor chips 51 may be arranged flat on a test board 50 with the terminal bend protecting frame intact, as shown in FIG. 5. Therefore, the occupying area per chip becomes large, with a small number of arrays of chips 51 for the test, which leads to a problem that the productivity is extremely poor especially in the accelerated test which extends over a long period of time.

Figure 6A:
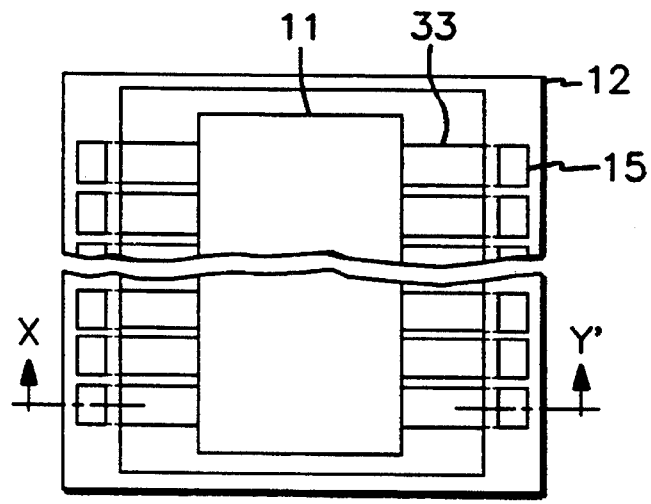
FIG. 6(a) and FIG. 6(b) are a plan view and a sectional view, respectively, showing an embodiment of the invention.
Figure 6B:
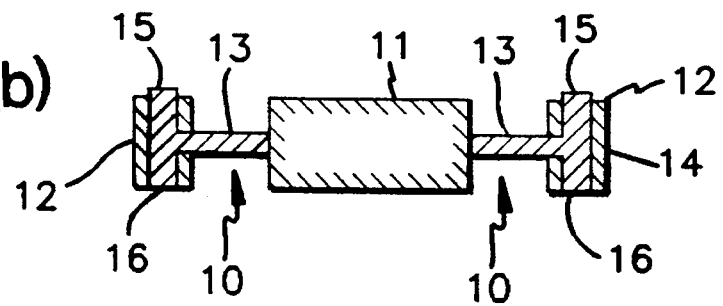
Figure 7A:
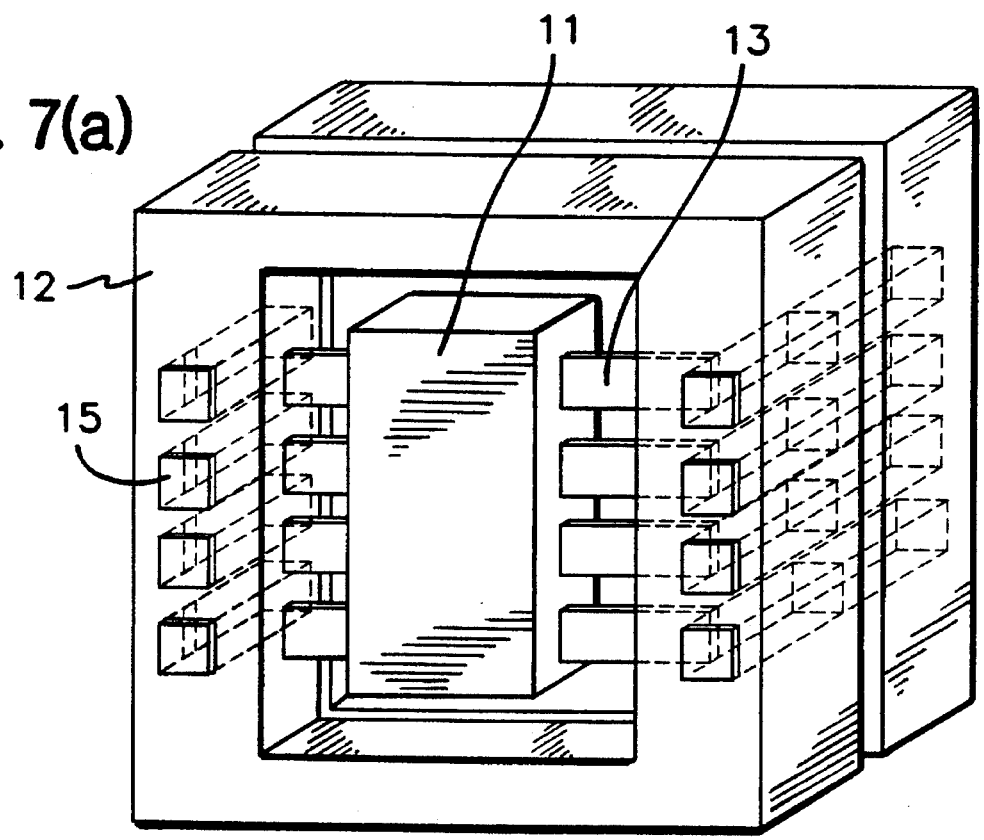
FIG. 7(a) is a drawing showing the state in which two of the semiconductors device as shown in FIG. 6(a) and FIG. 6(b) are placed one next to another.
Figure 7B:
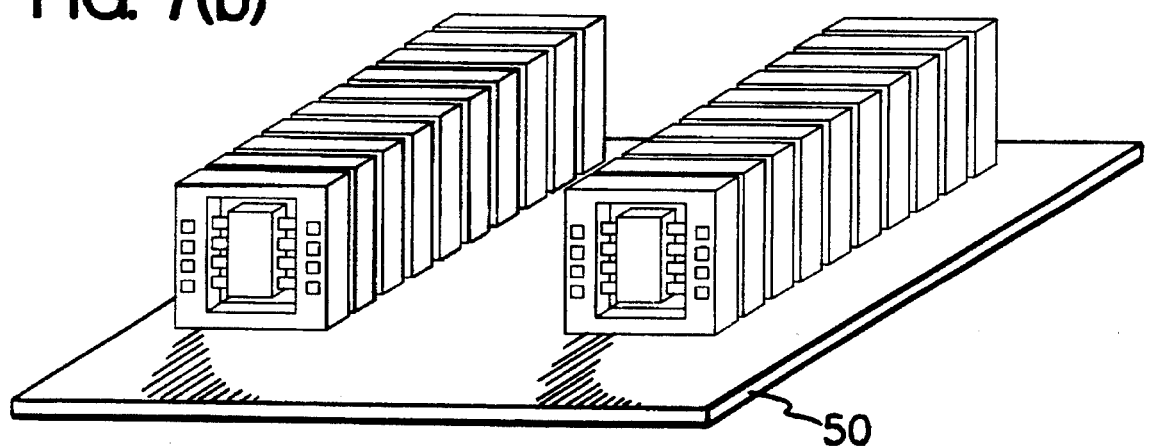
FIG. 7(b) is a drawing showing the mounting state of the semiconductor devices of the embodiment according to the invention on a test board.

Referring now to FIGS. 6(a) and 6(b), there is shown a semiconductor device according to an embodiment of the present invention. In this device, 11 is a chip sealing part or a package encapsulating a semiconductor chip (not shown), 12 is a lead terminal protecting frame, 10 is a lead terminal. The terminal 10 is composed of a tip part 14 and a remaining part 13. As is clear from FIG. 6(b), the tip part 14 of the terminal 10 is formed thicker than other parts 13 of the terminal 10, and its thickness is greater than the thickness of the chip sealing part 11 of the semiconductor device. In other words, each lead terminal 10 has first and second end portions extending upward and downward, respectively. The terminal protecting frame 12 of such a shape for protecting the terminals 10 is formed to have a thickness smaller than the thickness of the tip parts 14 of the terminals 10. The terminal protecting frame 12 made of the same material as the sealing material is formed in the sealing process of the chip. As shown in FIGS. 6(a) and 6(b), frame 12 is spaced apart from, and does not contact, chip sealing part 11, such that frame 12 is connected to part 11 solely by the exposed intermediate portions 13 of terminals 10. Since the terminal protecting frame 12 formed in the above manner and the tip part 14 of the terminal 10 have different thicknesses, the tip part 14 has exposed parts 15 and 16 even in the state where the terminal protecting frame 12 was formed, and, moreover, one or both of them are exposed in the form protruded from the terminal protecting frame 12. In FIG. 6(a) and FIG. 6(b) is shown the case where the exposed parts 15 are protruded. Since the thickness of the tip part 14 of the terminal is greater than the thickness of the chip sealing part 11 of the semiconductor device as mentioned above, when two of the devices are stacked against each other as shown in FIG. 7(a) and FIG. 7(b), respective terminals 10 of a stacking semiconductor device are electrically connected With the respective corresponding terminals 10 of the stacked semiconductor device by means of the exposed parts 15 and 16. In that case, since one or both of the exposed parts 15 and 16 form protrusions, secure contact between them can be established. Accordingly, even when a large number of the semiconductor devices are stacked against each other, all of the corresponding terminals are connected electrically. Therefore, a parallel accelerated test in the state where numerous semiconductor devices are stacked together and respective terminals 10 of the stacked devices are electrically connected with the respective corresponding terminals 10 of the stacked devices becomes feasible, and the occupying area per semiconductor on a test board 50 can be reduced to a large extent and the productivity of the process the accelerated test can be improved drastically since these semiconductor devices can be arranged in the stacked state rather than being arranged flat on the test board 50.

The tip parts 14 of the terminals 10 can be given the shape as described, by subjecting the terminals 10 to a pressing to give a greater thickness to the tip parts 14 than the other parts 13 in the pressing process during the formation of the leads. On the other hand, in order to form the terminal protecting frame 12 to be thinner than the tip parts 14 of the terminals 10, one needs only to form the terminal protecting frame 12 to have the same thickness as the thickness of the chip sealing part 11 of the semiconductor device. This is because the tip parts 14 of the terminals 10 are given a thickness greater than the thickness of the chip sealing part 11.

Figure 8:
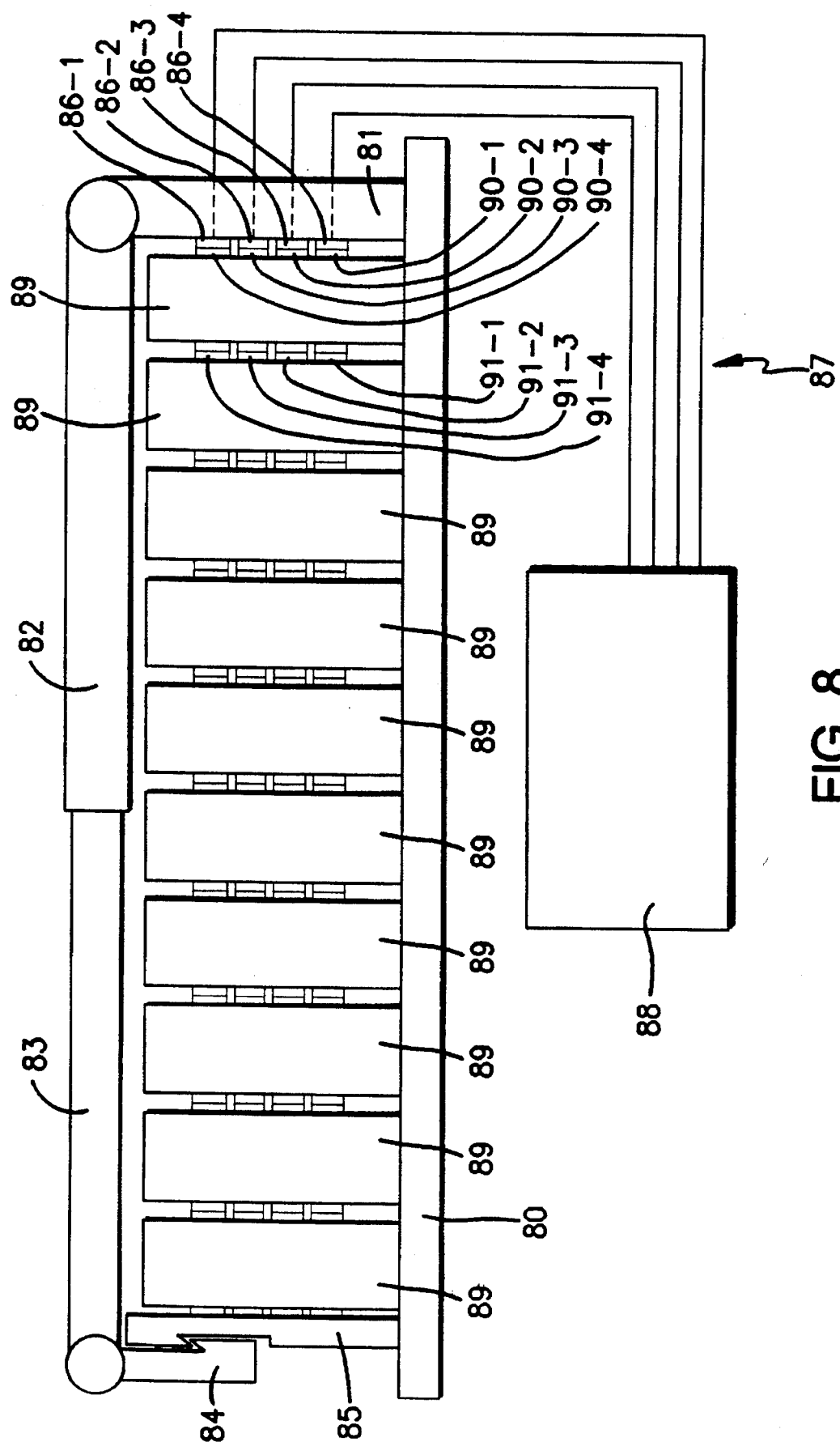
FIG. 8 is a side view showing a plurality of the semiconductor devices mounted on a test board and fixed by a fixing jig.

Referring to FIG. 8, a parallel test method for ten flat packages arranged in parallel, and more accordingly to this embodiment of the invention, will be explained below. The flat packages of semiconductor devices have terminal protecting frames 89, respectively. Terminal exposed parts 90-1 to 90-4 of the devices and terminal exposed parts 91-1 to 91-4 of the devices are exposed from the terminal protecting frames 89. In the FIG. 8, protrusion length over the protecting frame 89 of the terminal exposed parts 90-1 to 90-4 and 91-1 to 91-4 are overstated to ease understanding. Four terminal exposed parts 90-1 to 90-4 and four terminal exposed parts 91-1 to 91-4 composes four terminal tip parts, respectively. As shown in the FIG. 8, four terminal exposed parts 91-1 to 91-4 of a semiconductor device touch to form electrical contact with four terminal exposed parts 90-1 to 90-4 of a adjacently located semiconductor device, respectively. According to the manner, ten semiconductor devices are mounted on a test board 80 with a state that corresponding terminals of the devices are commonly connected, respectively.

For maintaining the connected state of the devices, first to fifth fixing jigs 81 to 85 are provided for the test board 80. The first fixing jig 81 has four electrodes 86-1 to 86-4 which are planned to connect to four terminal exposed parts 90-1 to 90-4 of adjacent semiconductor device, respectively. The fifth fixing jig 85 can be shifted along the test board 80. It enables to change distance between the first fixing jig 81 and fifth fixing jig 85 depending on a number of the devices to be tested. The first fixing jig 81 and the fifth fixing jig 85 are coupled via second, third and fourth fixing jigs 82, 83 and 84. The first fixing jig 81 and the second fixing jig 82, the third fixing jig 83 and the fourth fixing jig 84 are coupled by hinges, respectively. Distance between the second fixing jig 82 and third fixing jig 83 is changed depending on a number of devices to be tested. The fourth fixing jig 84 and the fifth fixing jig 85 are fixed to engage each other. Using the fixing jigs 81 to 85, the ten semiconductor devices are fixed to the test board 80 and parallel-connected state of the devices can be maintained.

The four electrodes 86-1 to 86-4 provided for the first fixing jig 81 are connected to a test signal generating equipment 88, respectively, via a bundle of wirings 87. The test signal generating equipment 88 commonly provides the ten semiconductor devices with both power voltage for the test and various input signals for the test.

Using such the test system described above, parallel accelerated test for the ten semiconductor devices of the embodiment of the invention can be performed. In addition, using the method, number of the semiconductor devices to be tested with a state mounted on a test board can be increased.

As described in the above, the semiconductor device according to the embodiment of this invention has an advantage in that, even though terminal protecting frame 12 made of resin or the like for preventing terminal bending is formed at the tip parts 14 of the terminals 10, it is possible to electrically connect corresponding terminals 10 of a plurality of semiconductor devices by mere stacking of them, which enables a parallel test of a large number of semiconductors devices at a time in the stacked state on the test board 50. Therefore, the productivity in the test process can be improved drastically. Since the package thickness is ordinarily on the order of about 1/5 to 1/10 of the package width, this device is expected to give an effect which improves the packaging efficiency from about five to ten times that of the conventional device.

Moreover, by subdividing the semiconductor devices into several segments at the time of testing, and appropriately inserting connection conversion substrates or the like, test for each segment will become possible.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within true scope of the invention.

What is claimed is:

1. A semiconductor device comprising a package sealing a semiconductor chip, a plurality of terminals each horizontally led out from said package and having an inner part, a tip part, and an intermediate part between said inner part and said tip part, said inner part of each of said terminals being encapsulated in said package, and a terminal protecting frame formed in contact with the tip part of each of said terminals to hold the respective tip parts of said terminals, said terminal protecting frame being spaced apart from and not contacting said package thereby to expose said intermediate part of each of said terminals, said tip part of each of said terminals having a thickness greater than a thickness of said package and a tip edge exposed from said terminal protecting frame.

2. The semiconductor device as claimed in claim 1, wherein said terminal protecting frame is made of a material equal to a material of said package.

3. The semiconductor device as claimed in claim 1, wherein said package and said terminal protecting frame have a thickness substantially equal to each other.

4. The device as claimed in claim 1, wherein said tip edge of each of said terminals projects vertically beyond said terminal protecting frame.

5. A semiconductor device comprising:
   a chip sealing part having opposing two major surfaces and side surface between said major surfaces;
   first and second outer leads arranged along said side surface of said chip sealing part, each of said first and second outer leads projecting from said side surface of said chip sealing part and having a tip portion and a remaining portion coupled between said tip portion and said chip sealing part, said tip portion being thicker than said remaining portion; and
   a protecting frame provided spaced apart from said chip sealing part to expose said remaining portion of said first and second outer leads, and having a thickness greater than said remaining portion of each of said first and second outer leads and covering first parts of said tip portions of said first and second outer leads and uncovering second parts of said tip portions of said first and second outer leads, said uncovered second parts serving as electric terminals.

6. The device as claimed in claim 5, wherein said protecting frame has first and second major surfaces and side surface between said first and second major surfaces, each of said second parts of said tip portions is revealed at said first major surface of said protecting frame, respectively.

7. The device as claimed in claim 5, wherein thickness of said tip portion of said first and second outer leads is greater than that of said protecting frame.

8. The device as claimed in claim 5, wherein said protecting frame uncovers third parts of said tip portions of said first and second outerleads, wherein each of said uncovered third parts serve as electric terminals.

9. The device as claimed in claim 8, wherein said protecting frame has first and second major surfaces and side surface between said first and second major surfaces, each of said second and third parts of said tip portions is revealed at said first and second major surfaces of said protecting frame, respectively.

10. The device as claimed in claim 5, wherein said second parts of said first and second outer leads project beyond said protecting frame in a direction perpendicular to said major surfaces.

\* \* \* \* \*